United States Patent
Zhao et al.

(10) Patent No.: US 7,317,355 B2
(45) Date of Patent: Jan. 8, 2008

(54) OVER-CURRENT DETECTION FOR A POWER FIELD-EFFECT TRANSISTOR (FET)

(75) Inventors: Shifeng Zhao, Plano, TX (US); Cetin Kaya, Plano, TX (US); James Teng, Dallas, TX (US); Claus Neesgaard, Plano, TX (US); Lieyi Fang, Plano, TX (US); Jeff Berwick, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 282 days.

(21) Appl. No.: 11/125,968

(22) Filed: May 10, 2005

(65) Prior Publication Data

US 2006/0256492 A1 Nov. 16, 2006

(51) Int. Cl.
*H03F 3/217* (2006.01)
(52) U.S. Cl. .................................. 330/251; 330/207 A
(58) Field of Classification Search ............ 330/207 A, 330/251, 288
See application file for complete search history.

(56) References Cited

U.S. PATENT DOCUMENTS 7,068,095 B2 * 6/2006 Bernardon ............... 330/251

FOREIGN PATENT DOCUMENTS

JP  02003283314 A  * 10/2003

* cited by examiner

*Primary Examiner*—Khanh Van Nguyen
(74) *Attorney, Agent, or Firm*—Wade J. Brady, III; Frederick J. Telecky, Jr.

(57) ABSTRACT

A system and method is provided for detecting an over-current condition in a power field-effect transistor (FET). In one embodiment, an over-current detection circuit for detecting an over-current condition in a power FET comprises a current generator circuit operative to generate a reference current and a plurality of matched FETs operative to receive the reference current and provide a reference voltage, the matched FETs being matched to each other and to the power FET. The over-current detection circuit also comprises a comparator operative to measure a drain-to-source voltage of the power FET and to provide an output that indicates that the drain-to-source voltage of the power FET has exceeded the reference voltage.

24 Claims, 4 Drawing Sheets

OVER-CURRENT DETECTION FOR A POWER FIELD-EFFECT TRANSISTOR (FET)

TECHNICAL FIELD

This invention relates to electronic circuits, and more specifically to over-current detection for a power-field effect transistor (FET).

BACKGROUND

In the field of electronic design, amplifier circuits, such as a class-D amplifier, are commonly used to convert a given input signal to a similar signal of a greater magnitude. Amplifier circuits can typically only operate within a given input signal magnitude range, beyond which the amplifier circuit, or other associated circuitry, can be damaged by an over-current condition. Circuit designers of amplifier circuits often design safeguards or limitations into the amplifier circuits, thus providing warnings or otherwise preventing the occurrence of over-current conditions.

To detect an over-current condition in an amplifier circuit, circuit designers often generate a reference voltage to compare with the output voltage of the amplifier circuit. The reference voltage that is compared with the output voltage of the amplifier is derived from circuitry that is separate from the amplifier circuit. However, this reference voltage does not take into account process variations that may result in the manufacture of a power field-effect transistor (FET) of the amplifier circuit, such as variations in temperature or the drain-to-source resistance $R_{DSon}$ of the power FET. These manufacturing variations may result in inaccurate detection of an over-current condition. This reference voltage is also a static specification dictated by the manufacturer, and is not subject to change to suit the needs of the end-user of the amplifier circuit. Additionally, voltage spikes that result from inrush current at activation and deactivation of the power FET may cause false over-current detection, thus undesirably shutting off the amplifier circuit at inappropriate times.

SUMMARY

In one embodiment of the present invention, an over-current detection circuit for detecting an over-current condition in a power field-effect transistor (FET) comprises a current generator circuit operative to generate a reference current and a plurality of matched FETs operative to receive the reference current and provide a reference voltage, the matched FETs being matched to each other and to the power FET. The over-current detection circuit also comprises a comparator operative to measure a drain-to-source voltage of the power FET and to provide an output that indicates that the drain-to-source voltage of the power FET has exceeded the reference voltage.

In another embodiment of the present invention, an over-current detection circuit for detecting an over-current condition in a power FET comprising a plurality of current-mirror stages operative to generate a reference current and a switch operative to deactivate at least one of the plurality of current-mirror stages, the reference current comprising a sum of current values supplied from each of the plurality of current-mirror stages. The over-current detection circuit also comprises a resistor having a resistance value, the current values supplied from each of the plurality of current-mirror stages being determined by the resistance value of the resistor, and the switch deactivating the at least one of the plurality of current-mirror stages upon the resistance value of the resistor being below a predetermined magnitude. The over-current detection further comprises a comparator operative to measure a drain-to-source voltage of the power FET and to provide an output that indicates that the drain-to-source voltage of the power FET has exceeded a reference voltage determined by the reference current.

In another embodiment of the present invention, an over-current detection circuit for detecting an over-current condition in a power FET comprising a comparator operative to measure a drain-to-source voltage of the power FET and to provide an output that indicates that the drain-to-source voltage of the power FET has exceeded a reference voltage, and a blanking control circuit operative to at least one of activate and deactivate the over-current detection circuit at predetermined times that correspond to activation and deactivation of the power FET.

In another embodiment of the present invention, a method for detecting an over-current condition in a power FET comprising summing current values from each of a plurality of current mirror stages to generate a reference current, the magnitude of the current values from each of the plurality of current mirror stages being determined by a resistance value of an external resistor and generating a reference voltage by passing a reference current through a plurality of matched FETs, the matched FETs being matched to each other and to the power FET. The method also comprises comparing a drain-to-source voltage of the power FET to the reference voltage at predetermined times corresponding to at least one of activation and deactivation of the power FET, and generating an over-current output signal upon the drain-to-source voltage of the power FET exceeding the reference voltage.

In another embodiment of the present invention, an over-current detection circuit for detecting an over-current condition in a power FET comprising means for generating a reference current based on a resistance value of an external resistor, and means for generating a reference voltage based on the reference current, the reference voltage and a drain-to-source voltage of the power FET being measurable relative to each other independent of manufacturing process variables. The over-current detection circuit also comprises means for activating and deactivating the over-current detection circuit at predetermined times based on activation and deactivation of the power FET, and means for generating an output upon a drain-to-source voltage of the power FET exceeding the reference voltage.

DETAILED DESCRIPTION

The present invention relates to electronic circuits, and more specifically to over-current detection for a power-field effect transistor (FET), such as could be used in a class-D amplifier or switching power supply. In one aspect of the invention, an over-current detection circuit with an external resistor is used to compare an output voltage of the power FET to a reference voltage. The external resistor has a resistance value that determines the value of a reference current. The reference current is received by a plurality of matched FETs (e.g., FETs manufactured from the same substrate and having similar design characteristics) to provide a reference voltage. The output voltage of the power FET is compared to the reference voltage to determine the presence of an over-current condition. The external resistor thus allows an end-user the ability to adjust the magnitude of the reference voltage, and thus an allowable output current of the power FET, to properly suit the application. The plurality of matched FETs are also matched to the power FET, thus compensating for process variables such as temperature and resistance to allow more accurate comparison of the reference voltage to the output voltage of the power FET in a variety of different operating conditions. In one aspect of the invention, false comparisons of the reference voltage to the output voltage of the power FET resulting from output voltage spikes at activation and deactivation of the power FET are reduced by adding a blanking control circuit. The blanking control circuit deactivates the over-current detection circuit during switching of the power FET to mitigate false over-current detection.

Figure 1:
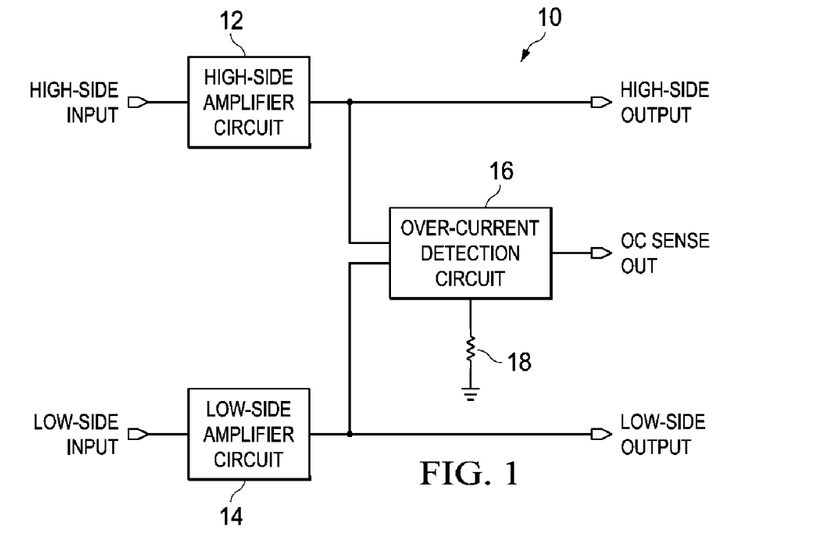
FIG. 1 illustrates an amplifier circuit with over-current detection in accordance with an aspect of the invention.

FIG. 1 illustrates an example of an amplifier circuit 10, such as a class-D amplifier, in accordance with an aspect of the invention. The amplifier circuit 10 includes a high-side, represented by a high-side amplifier circuit 12, and a low-side, represented by a low-side amplifier circuit 14. The high-side amplifier circuit 12 receives an input, denoted HIGH-SIDE INPUT and provides an output signal, denoted as HIGH-SIDE OUTPUT. The low-side amplifier circuit 14 receives an input, denoted LOW-SIDE INPUT and provides an output signal, denoted as LOW-SIDE OUTPUT. An over-current detection circuit 16 is coupled to the outputs of each of the high-side amplifier circuit 12 and the low-side amplifier circuit 14. The over-current detection circuit 16 thus receives inputs corresponding to the output voltages of each of the high-side amplifier circuit 12 and the low-side amplifier circuit 14. The over-current detection circuit 16 includes an external resistor 18 coupled to ground, and provides an output signal OC SENSE OUT. It is to be understood that, although the example of FIG. 1 demonstrates an amplifier circuit, any other type of circuit that includes a power FET, such as a switching power supply, can utilize the over-current detection circuit 16 in accordance with an aspect of the invention.

The over-current detection circuit 16 measures the output voltages of the high-side amplifier circuit 12 and the low-side amplifier circuit 14. If either of the output voltages of the high-side amplifier circuit 12 and the low-side amplifier circuit 14 are greater than a reference voltage, the over-current detection circuit 16 outputs the signal OC SENSE OUT. The over-current detection circuit 16 thus indicates that an over-current condition has occurred at either the high-side amplifier circuit 12 or the low-side amplifier circuit 14. The reference voltage is determined by a resistance value of the external resistor 18, such that different resistance values of the external resistor 18 can result in different reference voltage values.

It is to be understood that, although the example of FIG. 1 demonstrates an amplifier circuit 10 with both a high-side and a low-side, the over-current detection circuit 16 could work in accordance with an aspect of the invention with just one of either a high-side or a low-side. Additionally, in accordance with an aspect of the invention, the amplifier circuit 10 could include two separate over-current detection circuits 16, one for each of the high-side and the low-side, and each including a separate external resistor 18 for determining independent reference voltages for outputting separate OC SENSE OUT signals.

Figure 2:
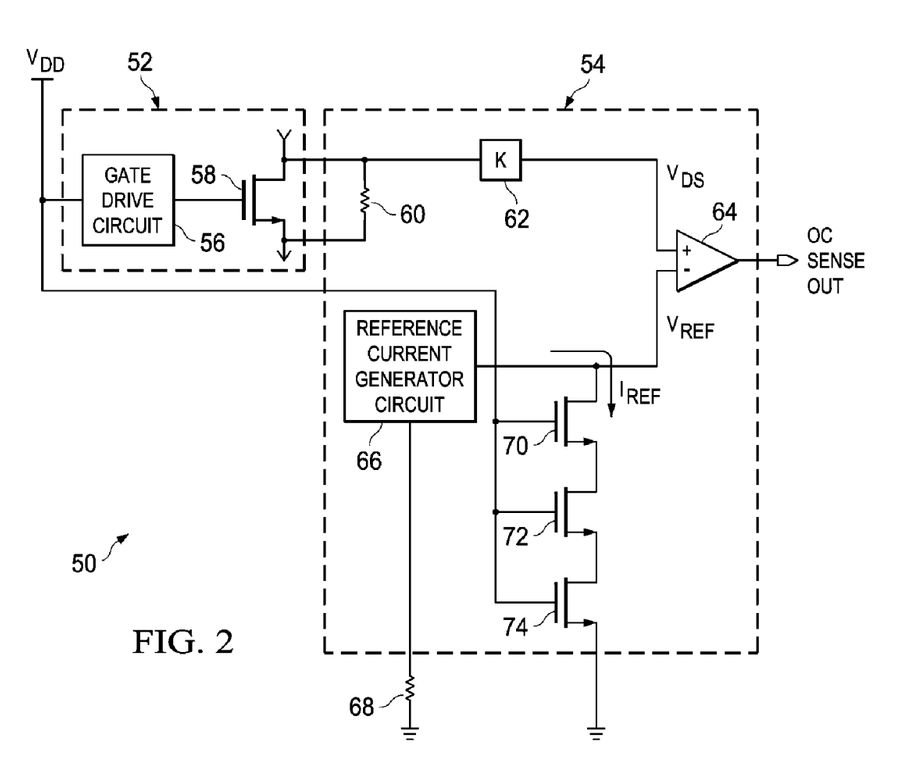
FIG. 2 illustrates an over-current detection circuit in accordance with an aspect of the invention.

FIG. 2 illustrates a circuit 50 including a switching driver circuit 52 and an over-current detection circuit 54 in accordance with an aspect of the invention. The switching driver circuit 52, which could be a low-side of an amplifier circuit, includes a gate drive circuit 56 and a power FET 58. The gate drive circuit 56 receives power from a positive supply voltage $V_{DD}$ and controls a gate terminal of the power FET 58. The over-current detection circuit 54 includes a resistor 60 coupled between a drain terminal and a source terminal of the power FET 58, such that the voltage measured by the over-current detection circuit 54 is a drain-to-source voltage $V_{DS}$ of the power FET 58. The voltage $V_{DS}$ is buffered by a gain amplifier 62, which could be a unity gain amplifier, and is input to a positive terminal of a comparator 64.

The over-current detection circuit 54 also includes a reference current generator circuit 66 that outputs a reference current $I_{REF}$. An external resistor 68 is coupled between the reference current generator circuit 66 and ground. The external resistor 68 has a resistance value $R_{EXT}$ that determines the magnitude of the reference current $I_{REF}$. The over-current detection circuit 54 includes three matched N-type FETs 70, 72, and 74 arranged in series, drain-to-source, interconnected between the output of the reference current generator circuit 66 and ground. It is to be understood that the matched FETs are matched to each other, such that they are manufactured from the same substrate with proportional and similar design characteristics, and thus have substantially the same operating characteristics. Each of the matched FETs 70, 72, and 74 has a gate terminal that is connected to the positive supply voltage $V_{DD}$, such that all three of the matched FETs 70, 72, and 74 are activated. Because the three matched FETs 70, 72, and 74 are all activated with the same positive supply voltage $V_{DD}$, each of them has a drain-to-source resistance $R_{DSon}$ that is substantially equal. The reference current $I_{REF}$, after being output from the reference current generator circuit 66, flows through the matched FETs 70, 72, and 74 to ground. This current flow through the matched FETs 70, 72, and 74 generates a reference voltage $V_{REF}$ that is input to a negative terminal of the comparator 64, such that $V_{REF}=I_{REF}*(3*R_{DSon})$. It is to be understood that, although the example of FIG. 2 demonstrates three matched FETs 70, 72, and 74, more or less than three matched FETs can be utilized to generate the reference voltage $V_{REF}$ in accordance with an aspect of the invention.

The comparator 64 compares the output voltage $V_{DS}$ of the power FET 58 to the reference voltage $V_{REF}$. If the voltage $V_{DS}$ is greater than the reference voltage $V_{REF}$, the comparator 64 outputs a signal OC SENSE OUT, which corresponds to an over-current condition such that excessive current is flowing through the power FET 58. The signal OC SENSE OUT can then be used for any purpose that the end-user of the amplifier sees fit, such as, for example, an alarm or a shut-off.

In addition to being matched to each other, the three matched FETs 70, 72, and 74 are also matched to the power FET 58. Because the three matched FETs 70, 72, and 74 are also matched to the power FET 58, and because the three matched FETs 70, 72, and 74 and the power FET 58 are all gate driven from the same positive supply voltage $V_{DD}$, the comparator 64 can compare the reference voltage $V_{REF}$ to the voltage $V_{DS}$ independent of process and temperature variables. This substantially increases over-current sensing accuracy in the over-current detection circuit 54. In addition, because the resistance value $R_{EXT}$ of the external resistor 68 determines the magnitude of the reference current $I_{REF}$, the end-user of the circuit 50 can set the resistance value $R_{EXT}$ of the external resistor 68 to generate a reference voltage $V_{REF}$ that best suits the application to which the circuit 50 is applied.

It is to be understood that, although the circuit 50 includes only one switching driver circuit 52 (e.g., a low-side of an amplifier circuit), it could also be implemented for a high-side driver of an amplifier circuit. For example, in a high-side driver circuit, a bootstrap architecture could be implemented. One such architecture could include a diode interconnected between the positive supply voltage $V_{DD}$ and the gate drive circuit 56, with a cathode at the gate drive circuit 56, and a capacitor interconnected between the cathode and the source terminal of the power FET 58. As another example, the over-current detection circuit 54 could include additional switching driver circuits, such as depicted in the example of FIG. 1, in accordance with an aspect of the invention. For example, the over-current detection circuit 54 could include additional comparators 64, one for each additional switching driver circuit, such that each additional comparator could compare a voltage $V_{DS}$ of a power FET from the corresponding additional switching driver circuit to the reference voltage $V_{REF}$. Alternatively, each additional switching driver circuit could have a separate corresponding over-current detection circuit, such that each additional switching driver circuit could compare a voltage $V_{DS}$ of its corresponding power FET to an independent reference voltage $V_{REF}$, for individual control of the over-current detection of each of the additional switching driver circuits.

Figure 3:
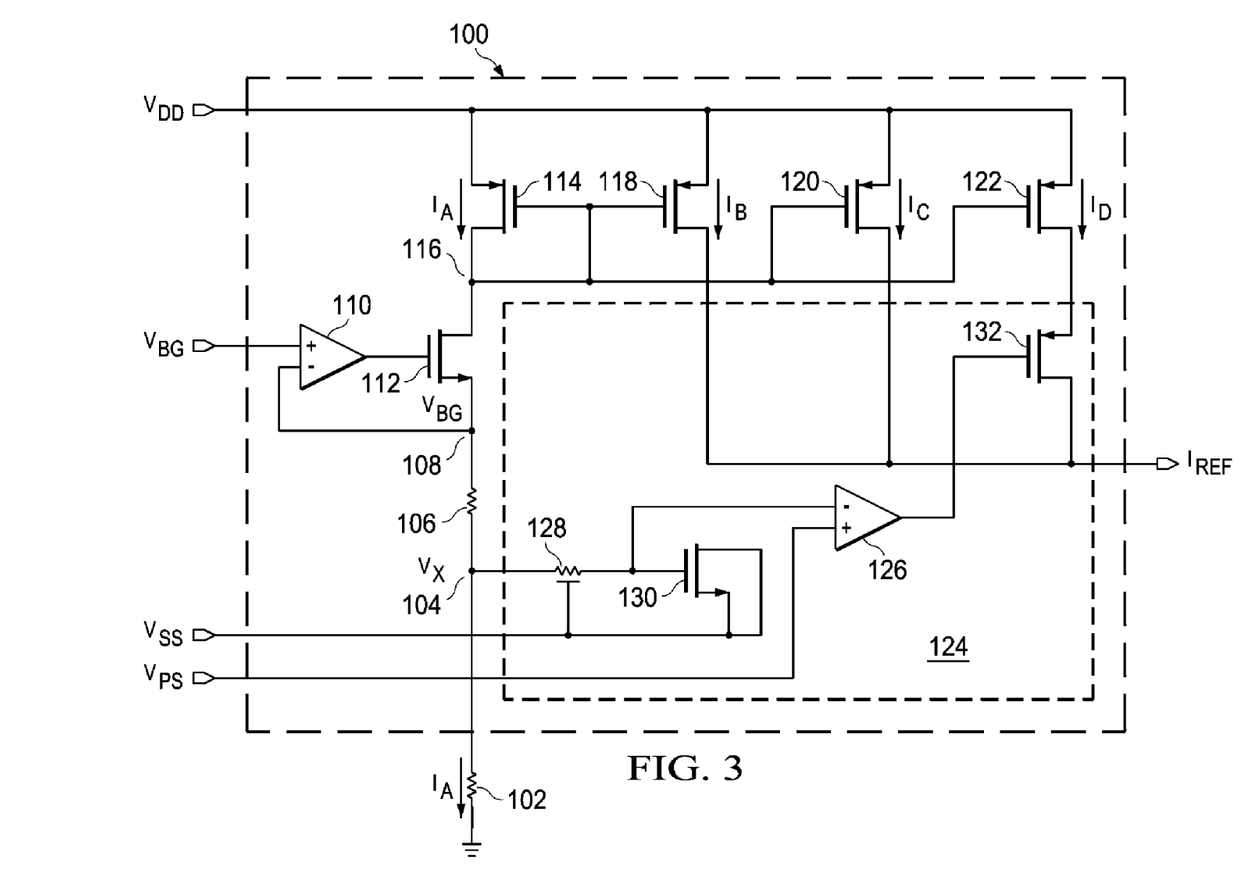
FIG. 3 illustrates a reference current generator circuit in accordance with an aspect of the invention.

FIG. 3 illustrates an example of a reference current generator circuit 100 operative to generate the reference current $I_{REF}$, in accordance with an aspect of the invention. An external resistor 102 is interconnected between ground and a node 104. As described above regarding FIG. 2, the reference current generator circuit 100 generates the reference current $I_{REF}$ based on a resistance value $R_{EXT}$ of the external resistor 102. An internal resistor 106 having a resistance value of $R_1$ is interconnected between the node 104 and a node 108. The node 108 is connected to a negative input to an op-amp 110 and a source terminal of an N-type FET 112. The op-amp 110 receives a band-gap voltage $V_{BG}$ at a positive input, and has an output connected to a gate terminal of the FET 112, such that the FET 112 is always activated and the op-amp 110 is arranged as a feedback buffer.

The band-gap voltage $V_{BG}$ can be independent of process and temperature variables. As an example, the band-gap voltage $V_{BG}$ could be approximately 1.2V-1.3V, but it is to be understood that any suitable value for the band-gap voltage $V_{BG}$ can be utilized in accordance with an aspect of the invention. Because the op-amp 110 is arranged as a feedback buffer, the voltage at the node 108 is also fixed approximately equal to the band-gap voltage $V_{BG}$. Accordingly, a current $I_A$ flows through the resistors 106 and 102, such that $I_A = V_{BG}/(R_1+R_{EXT})$.

The reference current generator circuit 100 includes a P-type FET 114 with a source terminal connected to a positive supply voltage $V_{DD}$, and with a gate and a drain terminal that are both connected to a node 116, such that the FET 114 is diode connected and thus always activated. Because the node 108 is fixed at approximately $V_{BG}$, the current flow through the FET 114 is approximately equal to the current $I_A$. The reference current generator circuit 100 also includes three output P-type FETs 118, 120, and 122, each with a gate terminal connected to the node 116, such that the output FETs 118, 120, and 122 are arranged as current-mirror stages. Accordingly, the current $I_A$ through the FET 114 is mirrored proportionally as a current $I_B$ through the output FET 118, as a current $I_C$ through the output FET 120, and as a current $I_D$ through the output FET 122. The currents $I_B$, $I_C$, and $I_D$ are all added together at an output of the reference current generator circuit 100 as the reference current $I_{REF}$.

It is to be understood that, although there are three current-mirror stages of output FETs 118, 120, and 122 in the example of FIG. 3, there can be more or less current-mirror stages in accordance with an aspect of the invention. In addition, the relationships between the values of the currents $I_A$, $I_B$, $I_C$, and $I_D$ is a matter of preference depending on the desired magnitude of the reference current $I_{REF}$, and can be modified by varying the channel widths of the output FETs. As an example, the substantial majority of the reference current $I_{REF}$ can be supplied by the current $I_D$ by making the channel width of the output FET 122 significantly larger than the channel widths of the other output FETs, such that $I_B=I_A$, $I_C=I_A$, and $I_D=(8*I_A)$. As an alternative, FETs of the same channel width can be chosen for the FETs 114, 118, 120, and 122 (e.g., $I_A=I_B=I_C=I_D$), or the channel widths of the output FETs could double from one current-mirror stage to the next (e.g., $I_B=(2*I_A)$, $I_C=(4*I_A)$, $I_D=(8*I_A)$).

As the resistance value $R_{EXT}$ of the external resistor 102 changes, the value of the current $I_A$ changes as well. More specifically, as demonstrated above, the current $I_A$ and the resistance value $R_{EXT}$ of the external resistor 102 have an inversely proportional relationship, such that the current $I_A$ decreases as the resistance value $R_{EXT}$ of the external resistor 102 increases. The magnitudes of the currents $I_B$, $I_C$, and $I_D$ are proportional to the magnitude of the current $I_A$ and have a sum that equals the reference current $I_{REF}$. Therefore, the resistance value $R_{EXT}$ of the external resistor 102 determines the value of the reference current $I_{REF}$. As described above regarding FIG. 2, the reference current $I_{REF}$ generates the reference voltage $V_{REF}$ to detect an over-current condition for a power FET used, for example, in a class-D amplifier. An end-user of an over-current detection circuit, such as the over-current detection circuit 54 in the example of FIG. 2, can thus set a resistance value $R_{EXT}$ that corresponds to a desired reference voltage $V_{REF}$.

As stated above, it is important to prevent over-current conditions in amplifiers to prevent damage to the circuit components of the amplifier. Because the resistance value $R_{EXT}$ of the external resistor 102 determines the reference voltage $V_{REF}$, an end-user of an amplifier with an over-current detection circuit in accordance with an aspect of the invention could attempt to push the reference voltage $V_{REF}$ to a value that is beyond an acceptable range of safe operation for the amplifier circuit. The end-user could attempt this by setting the resistance value $R_{EXT}$ of the external resistor 102 to a very low magnitude, such as very close to or equal to zero (e.g., short-circuiting the node 104 to ground). However, the reference current generator circuit 100 includes two safeguards to prevent the reference current $I_{REF}$ from becoming too large, thus preventing unsafe values of the reference voltage $V_{REF}$. The first such safeguard for preventing unsafe values of the reference voltage $V_{REF}$ is the inclusion of the internal resistor 106. Without the internal resistor 106, a resistance value $R_{EXT}=0$ of the external resistor 102 would cause a short circuit of the voltage $V_{BG}$ to ground, forcing the current $I_A$ to approach an infinite magnitude. The second such safeguard, in accordance with an aspect of the invention, is a sub-circuit 124 that also operates to prevent the reference current $I_{REF}$, and thus the reference voltage $V_{REF}$, from reaching an unsafe value.

The sub-circuit 124 includes a comparator 126 that has a positive input terminal that is connected to a preset voltage $V_{PS}$. The preset voltage $V_{PS}$ can be small, such as, for example, approximately 0.2V. The sub-circuit 124 also includes a resistor 128 and an N-type FET 130 interconnected between a negative input terminal of the comparator 126, a negative supply voltage $V_{SS}$, and the node 104. The resistor 128 and the FET 130 act as an RC filter, such that the negative input terminal of the comparator 126 can receive a steady measurement of a voltage $V_X$ at the node 104. The sub-circuit 124 also includes a P-type FET 132 that acts as a switch and has a gate terminal connected to an output of the comparator 126. The switch 132 is interconnected at a source terminal to the output FET 122 and at a drain terminal to the output of the reference current generator circuit 100.

As described above, the node 108 has a voltage that is fixed at approximately $V_{BG}$. Therefore, the voltage $V_X$ at the node 104 changes with different resistance values $R_{EXT}$ of the external resistor 102. Accordingly, the comparator 126 compares the voltage $V_X$ at the node 104 with the preset voltage $V_{PS}$. If the voltage $V_X$ is greater than the preset voltage $V_{PS}$, then the resistance value $R_{EXT}$ of the external resistor 102, as chosen by the end-user, is acceptable for normal operation of the amplifier circuit. The comparator 126 responds by outputting a low (e.g., logic 0) signal to the gate terminal of the switch 132, which activates (closes) the switch 132. When closed, the switch 132 conducts the current $I_D$ from its source terminal to its drain terminal, thus adding the current $I_D$ to the reference current $I_{REF}$. If the voltage $V_X$ is less than the preset voltage $V_{PS}$, then the resistance value $R_{EXT}$ of the external resistor 102, as chosen by the end-user, is too small for normal operation of the amplifier circuit. The comparator 126 responds by outputting a high (e.g., logic 1) signal, which deactivates (opens) the switch 132. When open, the switch 132 prevents conduction of the current $I_D$, such that the current-mirror stage that conducts the current $I_D$ is not added to the reference current $I_{REF}$. Therefore, the sub-circuit 124 can limit the amount of the reference current $I_{REF}$. An end-user can thus be prevented from pushing the reference voltage $V_{REF}$ to a value that is beyond an acceptable range of safe operation for the amplifier circuit, such as by setting the resistance value $R_{EXT}$ of the external resistor 102 to a very low magnitude (e.g., very close to or equal to zero). It is to be understood that, in accordance with an aspect of the invention, the sub-circuit 124 need not be limited to activating/deactivating only one of the current-mirror stages. Additional current-mirror stages can also be activated/deactivated to better control the amount of the reference current $I_{REF}$ based on the resistance value $R_{EXT}$ of the external resistor 102.

Figure 4:
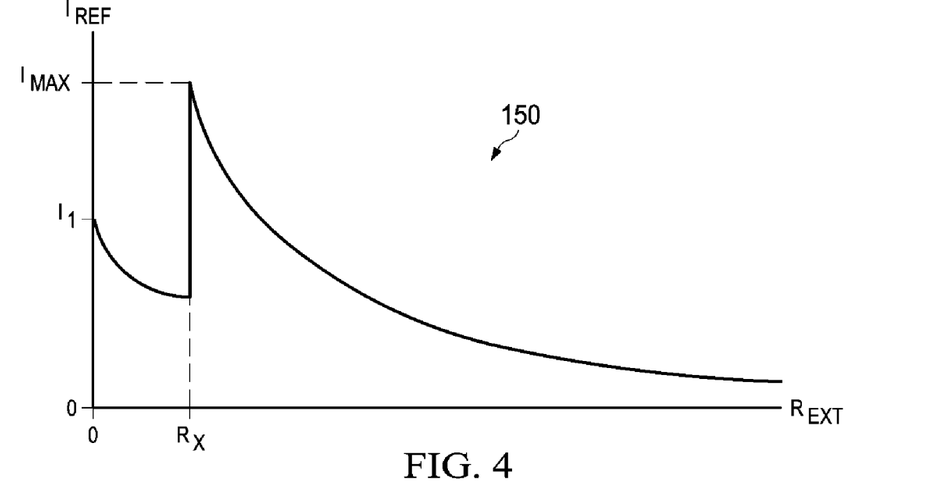
FIG. 4 illustrates a graph of reference current vs. resistance in accordance with an aspect of the invention.

FIG. 4, in continuance of the discussion of FIG. 3, illustrates a graph 150 of the resistance value $R_{EXT}$ versus the reference current $I_{REF}$. Accordingly, the graph 150 demonstrates the variations of the reference current $I_{REF}$ as a result of changes in the resistance value $R_{EXT}$ of the external resistor 102, in accordance with an aspect of the invention.

At a resistance value $R_{EXT}=0\Omega$, the reference current $I_{REF}$ is equal to $I_1$. As described above with regard to FIG. 3, the reference current generator circuit 100 prevents the reference current $I_{REF}$ from attaining a magnitude that would cause the reference voltage $V_{REF}$ to reach a value that is beyond an acceptable range of safe operation for the amplifier circuit by the inclusion of the internal resistor 106 and the sub-circuit 124 in accordance with an aspect of the invention. Such an unacceptable range of safe operation for the amplifier circuit of the reference voltage $V_{REF}$ could result from an end-user setting the resistance value $R_{EXT}$ of the external resistor 102 to a very low magnitude (e.g., very close to or equal to zero). Therefore, at $R_{EXT}$ being equal to $0\Omega$, as described above with regard to FIG. 3, the voltage $V_X$ at the node 104 is less than the preset voltage $V_{PS}$, such that the comparator 126 has opened the switch 132, preventing the current $I_D$ from being added to the reference current $I_{REF}$. As the resistance $R_{EXT}$ increases from zero, the magnitude of the reference current $I_{REF}$ decreases as there is less current $I_A$ flowing through the external resistor 102.

At a resistance value $R_{EXT}=R_X$, the reference current $I_{REF}$ increases substantially to $I_{MAX}$. It is at the point upon $R_{EXT}$ approximately equal to $R_X$ that the voltage $V_X$ at the node 104 becomes greater than the preset voltage $V_{PS}$, such that the comparator 126 has activated the switch 132, and thus adding the current $I_D$ to the reference current $I_{REF}$. As the resistance $R_{EXT}$ increases from $R_X$, the magnitude of the reference current $I_{REF}$ decreases as there is less current $I_A$ flowing through the external resistor 102.

It is to be understood that, in the example of FIG. 4, the relationship between the magnitudes of the reference current $I_{REF}$ at $I_{REF}=I_1$ and $I_{REF}=I_{MAX}$ need not be as depicted in the graph 150. For example, $I_1$ could be equal to or even greater than $I_{MAX}$. The relationship between $I_1$ and $I_{MAX}$ depends on a number of factors, such as the channel width of the output transistor 122, the resistance value $R_{EXT}$ of the external resistor 102 at $R_{EXT}=R_X$, the magnitude of the preset voltage $V_{PS}$, etc. The graph 150 is merely intended to demonstrate an example of the relative changes in the value of the reference current $I_{REF}$ as the resistance $R_{EXT}$ increases, in accordance with an aspect of the invention.

Figure 5:
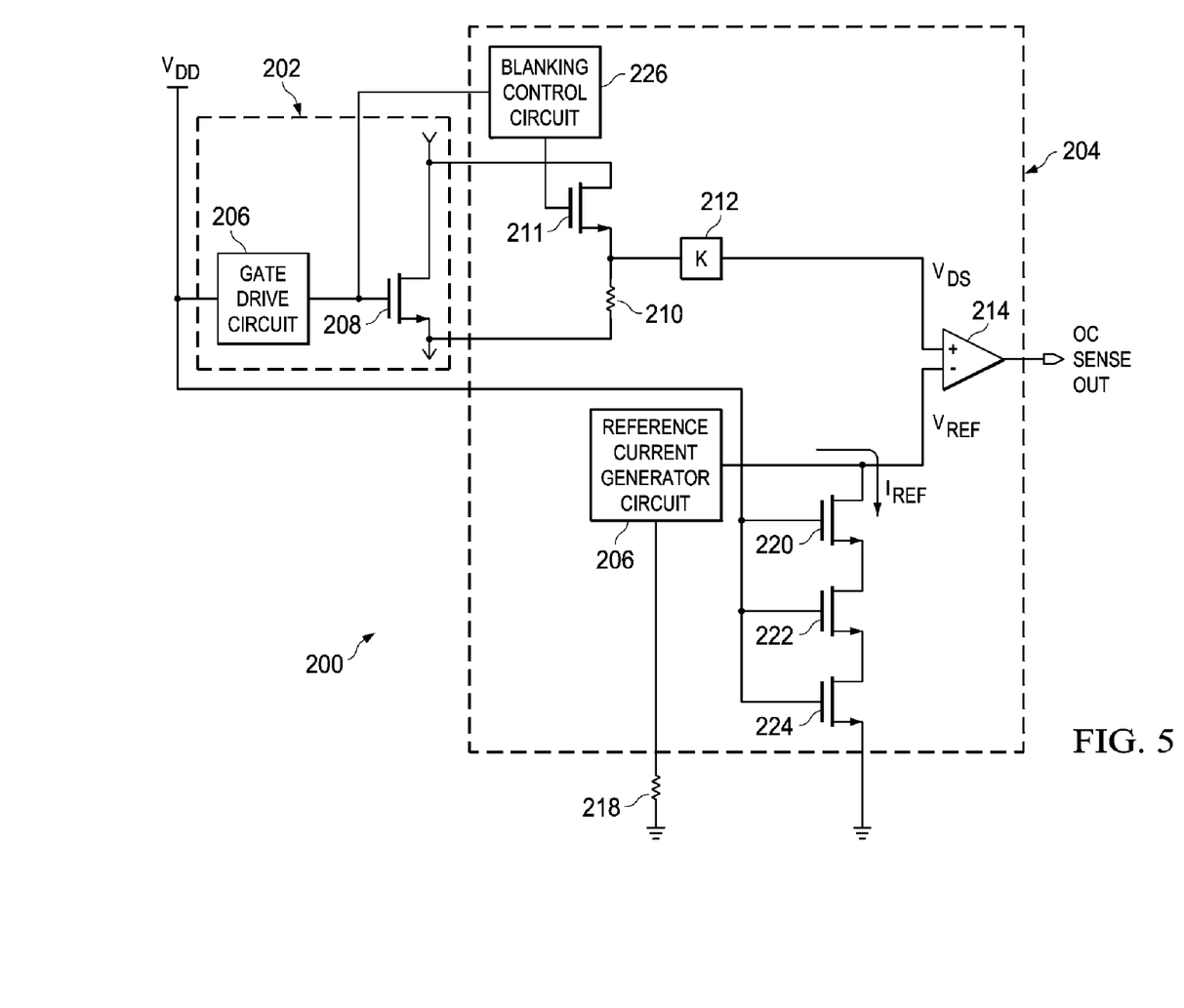
FIG. 5 illustrates an over-current detection circuit with blanking control in accordance with an aspect of the invention.

FIG. 5 illustrates another example of a circuit 200 including a switching driver circuit 202 and an over-current detection circuit 204 in accordance with an aspect of the invention. The switching driver circuit 202, which could be a low-side of an amplifier circuit, includes a gate drive circuit 206 and a power FET 208. The gate drive circuit 206 receives power from a positive supply voltage $V_{DD}$ and controls a gate terminal of the power FET 208. The over-current detection circuit 204 includes a resistor 210 and an N-type FET 211 coupled between a drain terminal and a source terminal of the power FET 208. The FET 211 acts as a switch, such that, when the switch 211 is closed, the voltage measured by the over-current detection circuit 204 is approximately a drain-to-source voltage $V_{DS}$ of the power FET 208. It is to be understood that the switch 211 need not be a FET, but could be any other type of switch known in the art. The voltage $V_{DS}$ is buffered by a gain amplifier 212, which could be a unity gain amplifier, and is input to a positive terminal of a comparator 214.

The over-current detection circuit 204 also includes a reference current generator circuit 216 that outputs a reference current $I_{REF}$. An external resistor 218 is coupled between the reference current generator circuit 216 and ground. The external resistor 218 has a resistance value that determines the magnitude of the reference current $I_{REF}$. The over-current detection circuit 204 includes three matched N-type FETs 220, 222, and 224 arranged in series, drain-to-source, interconnected between the output of the reference current generator circuit 216 and ground. Each of the matched FETs 220, 222, and 224 has a gate terminal that is connected to the positive supply voltage $V_{DD}$, such that all three of the matched FETs 220, 222, and 224 are activated. Because the three matched FETs 220, 222, and 224 are all activated with the same positive supply voltage $V_{DD}$, each of them has a drain-to-source resistance $R_{DSon}$ that is substantially equal. The reference current $I_{REF}$, after being output from the reference current generator circuit 216, flows through the matched FETs 220, 222, and 224 to ground. This current flow through the matched FETs 220, 222, and 224 generates a reference voltage $V_{REF}$ that is input to a negative terminal of the comparator 214, such that $V_{REF} = I_{REF} * (3*R_{DSon})$.

It is to be understood that, although the example of FIG. 5 demonstrates three matched FETs 220, 222, and 224, more or less than three matched FETs can be utilized to generate the reference voltage $V_{REF}$ in accordance with an aspect of the invention. It is to be further understood that, as described above regarding FIG. 2, the three matched FETs 220, 222, and 224 may also be matched to the power FET 208, as well as driven from the same positive supply voltage $V_{DD}$. The comparator 214 can therefore compare the reference voltage $V_{REF}$ to the voltage $V_{DS}$ independent of process and temperature variables, such that over-current sensing accuracy in the over-current detection circuit 204 is greatly increased. Additionally, because the resistance value of the external resistor 218 determines the magnitude of the reference current $I_{REF}$, the end-user of the circuit 200 can set the resistance value of the external resistor 218 to generate a reference voltage $V_{REF}$ that best suits the application to which the circuit 200 is applied.

The comparator 214 compares the output voltage $V_{DS}$ of the power FET 208 to the reference voltage $V_{REF}$. If the voltage $V_{DS}$ is greater than the reference voltage $V_{REF}$, the comparator 214 outputs a signal OC SENSE OUT, which corresponds to an over-current condition such that excessive current is flowing through the power FET 208. The signal OC SENSE OUT can then be used for any purpose that the end-user of the amplifier sees fit, such as, for example, an alarm or a shut-off.

The over-current detection circuit 204 of FIG. 5 also includes a blanking control circuit 226 interconnected between the output of the gate drive circuit 206 and a gate terminal of the switch 211. The blanking control circuit 226 operates to control the switch 211, such that the drain-to-source voltage $V_{DS}$ of the power FET 208 can be measured by the comparator 214 only at certain times. For example, when the gate drive circuit 206 initially drives the gate terminal of the power FET 208, the drain-to-source voltage $V_{DS}$ of the power FET 208 will spike due to the excessive inrush current upon activation. Such a voltage spike, if measured by the comparator 214, would most likely cause a false over-current measurement, resulting in the comparator 214 outputting the OC SENSE OUT signal at an undesired time. The blanking control circuit 226 therefore activates the switch 211 only when the drain-to-source voltage $V_{DS}$ would yield appropriate measurements for the purpose of determining the existence of an over-current condition in the power FET 208. For example, the blanking control circuit 226 could wait for a predetermined time after the gate drive circuit 206 drives the power FET 208 before activating the switch 211, such that a false over-current measurement due to inrush current can be avoided. A similar scenario may exist at deactivation of the power FET 208, such that the blanking control circuit 226 could deactivate the switch 211 for a predetermined time before and after deactivation of the power FET 208, such that a false over-current measurement due to a shut-off voltage spike can be avoided.

Figure 6:
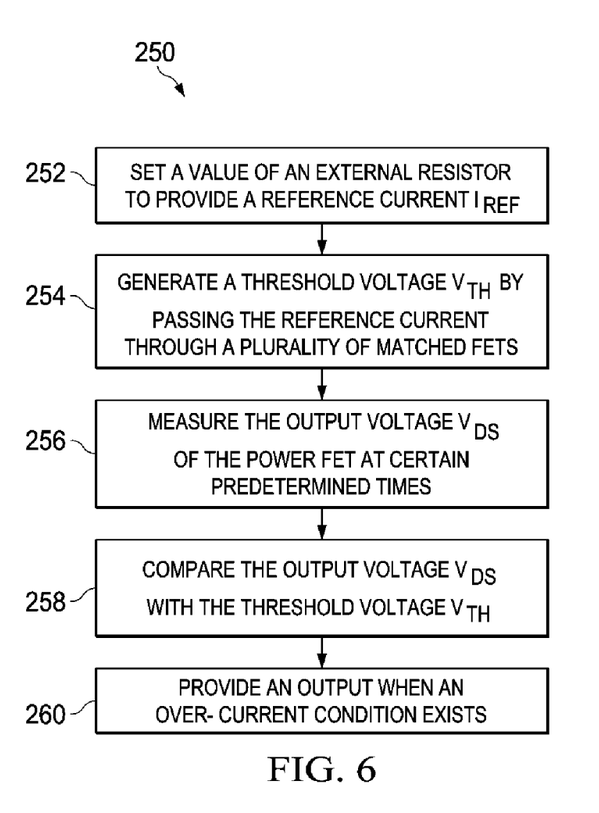
FIG. 6 illustrates a method for detecting an over-current condition in a power FET in accordance with an aspect of the invention.

In view of the foregoing structural and functional features described above, certain methods will be better appreciated with reference to FIG. 6. It is to be understood and appreciated that the illustrated actions, in other embodiments, may occur in different orders and/or concurrently with other actions. Moreover, not all illustrated features may be required to implement a method.

FIG. 6 demonstrates a method 250 for detecting an over-current flow through a power FET, such as could be used in a class-D amplifier, in accordance with an aspect of the invention. At 252, the method 250 sets a resistance value $R_{EXT}$ of an external resistor to provide a reference current $I_{REF}$. The external resistor could be provided by an end-user, and the resistance value $R_{EXT}$ of the external resistor determines the magnitude of the reference current $I_{REF}$. At 254, the method 250 generates a reference voltage $V_{REF}$ by passing the reference current $I_{REF}$ through a plurality of matched FETs. The plurality of matched FETs could also be matched to the power FET, and could be provided with a gate voltage that is the same as the power FET, such that the reference voltage $V_{REF}$ is generated independent of process variables and thermal conditions relative to the output voltage of the power FET. Also, since the resistance value $R_{EXT}$ of the external resistor sets the reference current $I_{REF}$, which is used to generate the reference voltage $V_{REF}$, the end-user can set the resistance value $R_{EXT}$ of the external resistor to best suite the end-user's application.

At 256, the method 250 measures the output voltage of the power FET, which could be a drain-to-source voltage $V_{DS}$, at certain predetermined times. The timing of the measurement of the output voltage of the power FET could be performed by a blanking control circuit. The predetermined times could be for a predetermined time before and after activation of the power FET and/or for a predetermined time before and after deactivation of the power FET. At 258, the method 250 compares the output voltage $V_{DS}$ of the power FET with the reference voltage $V_{REF}$. This comparison could be performed by a comparator. At 260, the method 250 provides an output upon an over-current condition resulting from an over-current flow through the power FET. The output could be provided by the comparator upon the comparator measuring that the output voltage $V_{DS}$ of the power FET is greater than the reference voltage $V_{REF}$. The output could be used to shut off the class-D amplifier for which the power FET is used, or to provide an over-current alarm, or for any other reason that an end-user of the class-D amplifier determines is necessary.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An over-current detection circuit for detecting an over-current condition in a power field-effect transistor (FET) comprising:
   a current generator circuit operative to generate a reference current;
   a plurality of matched FETs operative to receive the reference current and provide a reference voltage, the matched FETs being matched to each other and to the power FET; and
   a comparator operative to measure a drain-to-source voltage of the power FET and to provide an output that indicates that the drain-to-source voltage of the power FET has exceeded the reference voltage.

2. The circuit of claim 1, further comprising a positive supply voltage that supplies power to each of the plurality of matched FETs and to a gate drive circuit of the power FET.

3. The circuit of claim 1, further comprising a blanking control circuit, the blanking control circuit being operative to at least one of activate and deactivate the over-current detection circuit at predetermined times corresponding to activation and deactivation of the power FET.

4. The circuit of claim 3, wherein the blanking control circuit activates the over-current detection circuit based on a first time delay after the power FET activates and deactivates the over-current detection circuit based on a second time delay before the power FET deactivates.

5. The circuit of claim 1, wherein the current generator circuit comprises an external resistor, the resistance value of the external resistor determining the magnitude of the reference current.

6. The circuit of claim 1, wherein the current generator circuit comprises a plurality of current-mirror stages, the reference current comprising a sum of current values supplied from each of the plurality of current-mirror stages.

7. The circuit of claim 6, wherein the current values supplied from each of the plurality of current-mirror stages are determined by a resistance value of an external resistor.

8. The circuit of claim 6, wherein the current generator circuit further comprises a switch operative to deactivate at least one of the plurality of current-mirror stages upon the resistance value of the external resistor being below a predetermined amount.

9. An over-current detection circuit for detecting an over-current condition in a power field--effect transistor (FET) comprising:
   a plurality of current-mirror stages operative to generate a reference current;
   a switch operative to deactivate at least one of the plurality of current-mirror stages, the reference current comprising a sum of current values supplied from each of the plurality of current-mirror stages;
   a resistor having a resistance value, the current values supplied from each of the plurality of current-mirror stages being determined by the resistance value of the resistor, and the switch deactivating the at least one of the plurality of current-mirror stages upon the resistance value of the resistor being below a predetermined magnitude; and
   a comparator operative to measure a drain-to-source voltage of the power FET and to provide an output that indicates that the drain-to-source voltage of the power FET has exceeded a reference voltage determined by the reference current.

10. The circuit of claim 9, further comprising a plurality of matched FETs operative to receive the reference current to provide the reference voltage, the matched FETs being matched to each other and to the power FET.

11. The circuit of claim 10, further comprising a positive supply voltage that supplies power to each of the plurality of matched FETs and to a gate drive circuit of the power FET.

12. The circuit of claim 9, further comprising a blanking control circuit, the blanking control circuit being operative to at least one of activate and deactivate the over-current detection circuit at predetermined times corresponding to activation and deactivation of the power FET.

13. The circuit of claim 12, wherein the blanking control circuit activates the over-current detection circuit based on a first time delay after the power FET activates and deactivates the over-current detection circuit based on a second time delay before the power FET deactivates.

14. The circuit of claim 9, wherein the resistor is situated external to the over-current detection circuit.

15. The circuit of claim 9, wherein the at least one of the plurality of current-mirror stages deactivated by the switch provides a current value that is substantially higher than the current values supplied by the other of the plurality of current-mirror stages combined.

16. A method for detecting an over-current condition in a power field-effect transistor (FET) comprising:
   summing current values from each of a plurality of current mirror stages to generate a reference current, the magnitude of the current values from each of the plurality of current mirror stages being determined by a resistance value of an external resistor;
   generating a reference voltage by passing a reference current through a plurality of matched FETs, the matched FETs being matched to each other and to the power FET;
   comparing a drain-to-source voltage of the power FET to the reference voltage at predetermined times corresponding to at least one of activation and deactivation of the power FET; and
   generating an over-current output signal upon the drain-to-source voltage of the power FET exceeding the reference voltage.

17. The method of claim 16, wherein comparing the drain-to-source voltage of the power FET to the reference voltage further comprises suspending the comparison of the drain-to-source voltage of the power FET to the reference voltage for a first time period after activating the power FET, and suspending the comparison of the drain-to-source voltage of the power FET to the reference voltage for a second time period before deactivating the power FET.

18. The method of claim 16, further comprising providing a positive supply voltage to the plurality of matched FETs and to a gate drive circuit for the power FET.

19. The method of claim 16, further comprising deactivating at least one of the plurality of current-mirror stages to prevent the magnitude of the reference current from exceeding a predetermined amount.

20. The method of claim 19, wherein the predetermined amount of the magnitude of the reference current is determined by the resistance value of the external resistor being below a predetermined amount.

21. An over-current detection circuit for detecting an over-current condition in a power field-effect transistor (FET) comprising:
   means for generating a reference current based on a resistance value of an external resistor;
   means for generating a reference voltage based on the reference current, the reference voltage and a drain-tosource voltage of the power FET being measurable relative to each other independent of manufacturing process variables;

means for activating and deactivating the over-current detection circuit at predetermined times based on activation and deactivation of the power FET; and means for generating an output upon a drain-to-source voltage of the power FET exceeding the reference voltage.

22. The circuit of claim 21, further comprising means for limiting the value of the reference current.

23. A switching power supply comprising the over-current detection circuit of claim 21.

24. A class-D amplifier comprising the over-current detection circuit of claim 21.

* * * * *